United States Patent
Choi et al.

(10) Patent No.: US 10,020,273 B2
(45) Date of Patent: Jul. 10, 2018

(54) SEMICONDUCTOR DEVICES AND METHODS OF FORMING THE SAME

(71) Applicant: Samsung Electronics Co., Ltd., Suwon-si, Gyeonggi-do (KR)

(72) Inventors: Ju-il Choi, Seongnam-si (KR); Hyoju Kim, Seoul (KR); Byunglyul Park, Seoul (KR); Yeun-Sang Park, Yongin-si (KR); Jubin Seo, Seongnam-si (KR); Atsushi Fujisaki, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 10 days.

(21) Appl. No.: 15/345,614

(22) Filed: Nov. 8, 2016

(65) Prior Publication Data
US 2017/0148753 A1 May 25, 2017

(30) Foreign Application Priority Data

Nov. 19, 2015 (KR) .................. 10-2015-0162573

(51) Int. Cl.
*H01L 23/00* (2006.01)
*H01L 25/065* (2006.01)

(52) U.S. Cl.
CPC .......... *H01L 24/13* (2013.01); *H01L 25/0657* (2013.01); *H01L 2224/13006* (2013.01); *H01L 2224/13025* (2013.01); *H01L 2224/13026* (2013.01); *H01L 2224/13083* (2013.01); *H01L 2224/13147* (2013.01); *H01L 2224/13155* (2013.01); *H01L 2224/13211* (2013.01); *H01L 2224/13239* (2013.01); *H01L 2225/06513* (2013.01); *H01L 2225/06517* (2013.01); *H01L 2225/06541* (2013.01); *H01L 2225/06544* (2013.01); *H01L 2924/15311* (2013.01)

(58) Field of Classification Search
CPC ........................... H01L 24/13; H01L 25/0657
See application file for complete search history.

(56) References Cited

U.S. PATENT DOCUMENTS

| 5,384,283 A | 1/1995 | Gegenwarth et al. |
| 6,417,089 B1 * | 7/2002 | Kim ..................... H01L 24/11 |
| | | 257/E21.508 |
| 6,774,495 B2 | 8/2004 | Kim |

(Continued)

FOREIGN PATENT DOCUMENTS

KR  10-2002-0060307   7/2002

*Primary Examiner* — Long Pham
(74) *Attorney, Agent, or Firm* — Myers Bigel, P.A.

(57) ABSTRACT

According to aspects provided herein, a semiconductor device may include a bump providing improved reliability and reduced size. In some aspects, a conductive pad may be formed on a substrate, and a conductive support layer, which may be a pillar, may be formed on the conductive pad. An intermetallic compound (IMC) layer may be formed on the conductive support layer, and a solder layer may be formed on the IMC layer. In some aspects, the conductive support layer may be of a smaller width than the IMC layer. In some aspects, the conductive support layer may have side surfaces which are wider at the solder side than at the conductive pad side. In some aspects, other layers may be formed, such as a seed layer between the conductive pad and the conductive support layer, or a barrier layer between the conductive support layer and the IMC layer.

20 Claims, 14 Drawing Sheets

(56) References Cited

U.S. PATENT DOCUMENTS

| | | |
|---|---|---|
| 7,199,036 B2 | 4/2007 | Chan et al. |
| 8,736,050 B2 | 5/2014 | Huang et al. |
| 8,980,739 B2 * | 3/2015 | Cho .................. H01L 24/11 |
| | | 438/614 |
| 2008/0261390 A1 | 10/2008 | Chen et al. |
| 2013/0341786 A1 * | 12/2013 | Hsu ................ H01L 21/4857 |
| | | 257/737 |

* cited by examiner

SEMICONDUCTOR DEVICES AND METHODS OF FORMING THE SAME

CROSS-REFERENCE TO RELATED APPLICATION

This U.S. non-provisional patent application claims priority under 35 U.S.C. § 119 to Korean Patent Application No. 10-2015-0162573 filed on Nov. 19, 2015, the disclosure of which is hereby incorporated by reference in its entirety for all purposes.

BACKGROUND

Aspects of the present disclosure relate to semiconductor devices.

As semiconductor devices are highly integrated, the reduction of the size of bumps may be desirable. In order to reduce the size of the bumps and to improve the reliability thereof, research on a method of forming a bump having various metal layers has been progressing. An intermetallic compound (IMC) layer can be formed between different metal layers. The reliability of the bump may depend upon the types of constituent materials of the IMC layer. Therefore, a technique for controlling the constituent materials of the IMC layer is desirable.

SUMMARY

Example embodiments of the present disclosure provide a semiconductor device having a bump of increased reliability, which may include a conductive support layer such as a pillar.

Other example embodiments of the present disclosure provide a method of forming a semiconductor device having a bump of increased reliability which may include a conductive support layer such as a pillar.

The technical objectives of the present disclosure are not limited to the above disclosure; other objectives may become apparent to those of ordinary skill in the art based on the following descriptions.

In accordance with an aspect of the present disclosure, a semiconductor device is provided. The device may include a conductive pad formed on a substrate. A conductive support layer may be on the conductive pad. An intermetallic compound (IMC) layer may be on the conductive support layer. A solder layer may be on the IMC layer. The conductive support layer may have a smaller width than the IMC layer.

A barrier layer may be formed between the conductive support layer and the IMC layer.

A horizontal width of the barrier layer and a horizontal width of the IMC layer may be equal.

The conductive support layer may have a smaller width than the barrier layer.

Side surfaces of the IMC layer may be vertically aligned with side surfaces of the barrier layer.

Side surfaces of the IMC layer and barrier layer may be substantially coplanar.

The solder layer may be in contact with side surfaces of the IMC layer. A lower end of the solder layer may be formed between an upper end of the IMC layer and a lower end of the barrier layer.

The conductive support layer may include a copper (Cu) layer. The barrier layer may include a nickel (Ni) layer. The IMC layer may include a copper-tin (CuSn) layer. The solder layer may include a tin-silver (SnAg) layer.

The IMC layer may include inclined side surfaces. The inclined side surfaces of the IMC layer may have inverted inclines.

A reaction layer may be formed between the barrier layer and the IMC layer. The reaction layer may include a Cu layer.

The reaction layer may have a smaller horizontal width than the barrier layer and the IMC layer. The reaction layer may include inclined side surfaces. The inclined side surfaces of the reaction layer may have inverted inclines. The IMC layer may include inclined side surfaces. The inclined side surfaces of the IMC layer may have inverted inclines.

A seed layer may be formed between the conductive pad and the conductive support layer.

The seed layer may have a smaller horizontal width than the conductive support layer.

The seed layer may include a first seed layer having titanium (Ti), and a second seed layer having copper (Cu) and formed on the first seed layer. The first seed layer may have a smaller horizontal width than the second seed layer.

In accordance with an aspect of the present disclosure, a semiconductor device is provided. The device may include a conductive pad formed on a first substrate. A conductive support layer may be on the conductive pad. A barrier layer may be on the conductive support layer. An IMC layer may be on the barrier layer. A solder layer may be on the IMC layer. A second substrate may be on the solder layer. The conductive support layer may have a smaller width than the IMC layer.

In accordance with an aspect of the present disclosure, a semiconductor device is provided. The device may include a first semiconductor chip formed on an interposer. A bump may be formed between the interposer and the first semiconductor chip. At least one second semiconductor chip may be formed on the first semiconductor chip. The bump may include a barrier layer formed on a conductive support layer. An IMC layer may be formed on the barrier layer. A solder layer may be formed on the IMC layer. The conductive support layer may have a smaller width than the IMC layer.

The conductive support layer may have a smaller width than the barrier layer.

In accordance with an aspect of the present disclosure, a method of forming a semiconductor device is provided. The method may include forming a seed layer on a substrate having a conductive pad. A conductive support layer may be formed on the seed layer. A barrier layer may be formed on the conductive support layer. A reaction layer may be formed on the barrier layer. A solder layer may be formed on the reaction layer. An IMC layer may be formed between the barrier layer and the solder layer using a reflow process. The seed layer and the conductive support layer may be etched.

The etching of the seed layer and the conductive support layer may be performed after the IMC layer is formed using the reflow process.

The conductive support layer may have a smaller width than the IMC layer.

A horizontal width of the barrier layer may be substantially the same as a horizontal width of the IMC layer.

The conductive support layer may have a smaller width than the barrier layer.

Side surfaces of the IMC layer may be vertically aligned with side surfaces of the barrier layer.

Side surfaces of the IMC layer and barrier layer may be substantially coplanar.

The solder layer may be in contact with side surfaces of the IMC layer. A lower end of the solder layer may be formed between an upper end of the IMC layer and a lower end of the barrier layer.

The conductive support layer may include a copper (Cu) layer. The barrier layer may include a nickel (Ni) layer. The reaction layer may include a Cu layer. The IMC layer may include a copper-tin (CuSn) layer. The solder layer may include a tin-silver (SnAg) layer.

After the seed layer and the conductive support layer are etched, the reaction layer may remain between the barrier layer and the IMC layer. The reaction layer which remains between the barrier layer and the IMC layer may have a smaller horizontal width than the barrier layer and the IMC layer.

After the seed layer and the conductive support layer are etched, the seed layer may remain between the conductive pad and the conductive support layer. The seed layer may have a smaller horizontal width than the conductive support layer.

The seed layer may include a first seed layer having Ti, and a second seed layer having Cu and formed on the first seed layer. The first seed layer may have a smaller horizontal width than the second seed layer.

In accordance with an aspect of the present disclosure, a method of forming a semiconductor device is provided. The method may include forming a conductive support layer on a substrate having a conductive pad. An IMC layer may be formed on the conductive support layer. A solder layer may be formed on the IMC layer. The conductive support layer may have a smaller width than the IMC layer.

In accordance with an aspect of the present disclosure, a semiconductor device is provided. The semiconductor device may include a conductive pad on a substrate, a seed layer on the conductive pad, and a conductive support layer having a first width on the seed layer. A compound metal layer having a second width greater than the first width may be on the conductive support layer, and a solder layer may be on the compound metal layer.

The seed layer may include a first seed layer and a second seed layer, and the first seed layer may include a titanium (Ti) layer formed through physical vapor deposition, and the second seed layer may include a copper (Cu) layer formed through physical vapor deposition. In some aspects, a vertical thickness of the conductive support layer is at least 0.5 times the first width. In some aspects, there may be an undercut region between the conductive support layer and the substrate, and the seed layer may be a third width smaller than the first width and the second width. Corners of the conductive support layer closest to the substrate may be rounded.

Details of other example embodiments are included in detailed descriptions and the drawings.

BRIEF DESCRIPTION OF THE DRAWINGS

The foregoing and other features and advantages of aspects of the present disclosure will be apparent from reading and review of the detailed description of the present disclosure. Various principles of the present disclosure are illustrated in the accompanying drawings in which like reference characters refer to the same parts throughout the different views. The drawings are not necessarily to scale, emphasis instead being placed upon illustrating the principles of the present disclosure. In the drawings.

DETAILED DESCRIPTION

Figure 1:
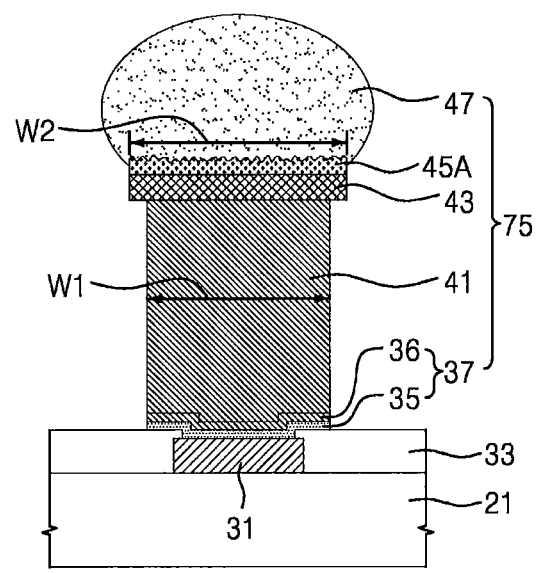
FIGS. 1 to 13 are cross-sectional views illustrating a semiconductor device according to aspects of the present disclosure.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIGS. 1 to 13 are cross-sectional views for describing a semiconductor device according to aspects of the present disclosure.

Referring to FIG. 1, the semiconductor device according to aspects of the present disclosure may include a conductive pad 31 formed on a substrate 21, a protective layer 33, a seed layer 37, a conductive support layer 41, a barrier layer 43, an intermetallic compound (IMC) layer 45A, and a solder layer 47. The seed layer 37, the conductive support layer (which may be referred to herein as a pillar) 41, the barrier layer 43, the IMC layer 45A, and the solder layer 47 may constitute a bump 75. The bump 75 may be interpreted as a pillar bump.

The seed layer 37 may have a greater width than the conductive pad 31. The seed layer 37 may be directly in contact with the conductive pad 31 and may extend over the protective layer 33. The seed layer 37 may be formed between the conductive pad 31 and the conductive support layer 41. A vertical thickness of the seed layer 37 may be smaller than that of the conductive support layer 41. The seed layer 37 may include a first seed layer 35 and a second seed layer 36 formed on the first seed layer 35. The first seed layer 35 may include a titanium (Ti) layer formed through a physical vapor deposition (PVD) method. The first seed layer 35 may be directly in contact with the conductive pad 31. The second seed layer 36 may include a Cu layer formed through a PVD method.

The conductive support layer 41, which may be referred to as a pillar, may be directly in contact with the seed layer 37. The conductive support layer 41 may include copper (Cu), cobalt (Co), nickel (Ni), or a combination thereof. For example, the conductive support layer 41 may include a Cu layer formed through an electroplating method. A vertical thickness of the conductive support layer 41 may be at least 0.5 times a horizontal width thereof. For example, the vertical thickness of the conductive support layer 41 may be in a range of 0.5 times to 2 times the horizontal width thereof. The conductive support layer 41 may have a cylindrical shape, an octagonal pillar shape, or a polygonal pillar shape. The conductive support layer 41 may have a smaller width than the barrier layer 43. The conductive support layer 41 may have a first horizontal width W1.

The barrier layer 43 may cover an upper surface of the conductive support layer 41. The barrier layer 43 may be interposed between the conductive support layer 41 and the IMC layer 45A. A vertical thickness of the barrier layer 43 may be smaller than that of the conductive support layer 41. The barrier layer 43 may include Cu, Co, Ni, or a combination thereof. The barrier layer 43 may include a material different from the conductive support layer 41. For example, the barrier layer 43 may include a Ni layer formed through an electroplating method. The barrier layer 43 may serve to block the diffusion of constituent materials of the conductive support layer 41 into the IMC layer 45A and the solder layer 47.

The IMC layer 45A may be formed between the barrier layer 43 and the solder layer 47. The IMC layer 45A may be directly in contact with the barrier layer 43 and the solder layer 47. A vertical thickness of the IMC layer 45A may be equal to or smaller than that of the barrier layer 43. A width of the IMC layer 45A may be substantially the same as that of the barrier layer 43. The IMC layer 45A may have a second horizontal width W2. The second horizontal width W2 may be greater than the first horizontal width W1. Side surfaces of the IMC layer 45A may be vertically aligned with side surfaces of the barrier layer 43. The side surfaces of the IMC layer 45A and barrier layer 43 may be substantially coplanar. The IMC layer 45A may include a copper-tin (CuSn) layer.

The solder layer 47 may cover the IMC layer 45A. The solder layer 47 may be in contact with the side surfaces of the IMC layer 45A. A lower end of the solder layer 47 may be formed between an upper end of the IMC layer 45A and a lower end thereof. A vertical thickness of the solder layer 47 may be smaller than that of the conductive support layer 41. The solder layer 47 may include tin (Sn), silver (Ag), indium (In), copper (Cu), or a combination thereof. For example, the solder layer 47 may include a tin-silver (SnAg) layer or a tin-silver-copper (SnAgCu) layer.

Figure 2:
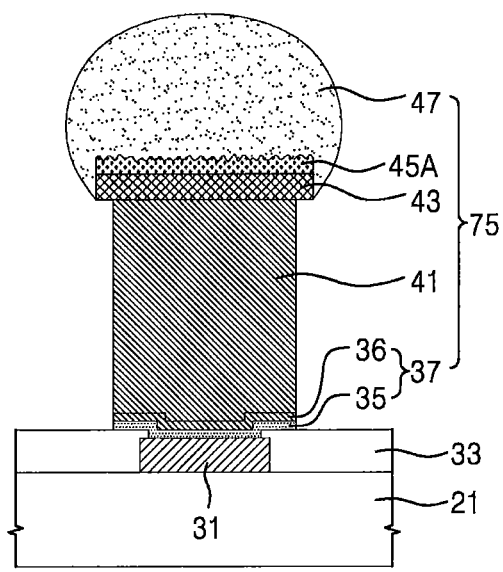

Referring to FIG. 2, the solder layer 47 may cover the side surfaces of the IMC layer 45A and may be in contact with the side surfaces of the barrier layer 43. The lower end of the solder layer 47 may be formed between the upper end of the IMC layer 45A and a lower end of the barrier layer 43.

Figure 3:
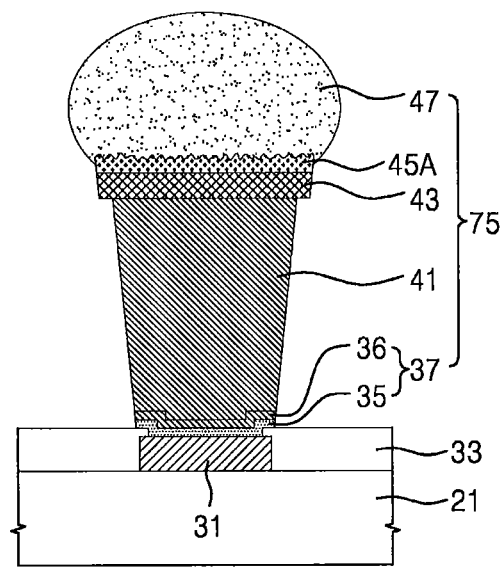

Referring to FIG. 3 the conductive support layer 41 may include inclined side surfaces. The conductive support layer 41 may have an inverted trapezoidal shape of which a width of an upper portion is greater than that of a lower portion in a cross-sectional view. A horizontal width of the IMC layer 45A may be greater than that of the conductive support layer 41.

Figure 4:
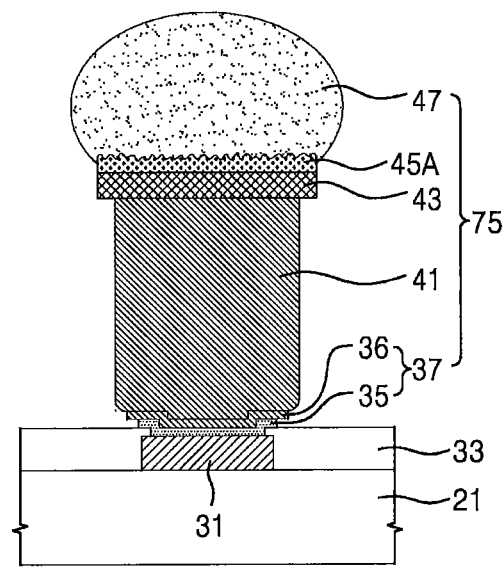

Referring to FIG. 4, the seed layer 37 may have a smaller width than the conductive support layer 41. Undercut regions may be formed under the conductive support layer 41. Lower corners of the conductive support layer 41 may be roundly formed. The first seed layer 35 may have a smaller width than the second seed layer 36. The second seed layer 36 may have a smaller width than a lower surface of the conductive support layer 41.

Figure 5:
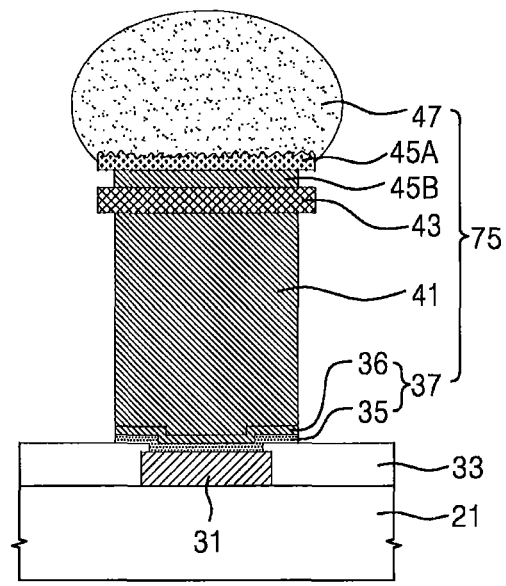

Referring to FIG. 5, a reaction layer 45B may be present between the barrier layer 43 and the IMC layer 45A.

The reaction layer 45B may directly contact the IMC layer 45A and the barrier layer 43. A horizontal width of the reaction layer 45B may be smaller than that of the IMC layer 45A. The horizontal width of the reaction layer 45B may be smaller than that of the barrier layer 43. A vertical thickness of the reaction layer 45B may be smaller than that of the barrier layer 43. The reaction layer 45B may include a Cu layer formed through an electroplating method.

Figure 6:
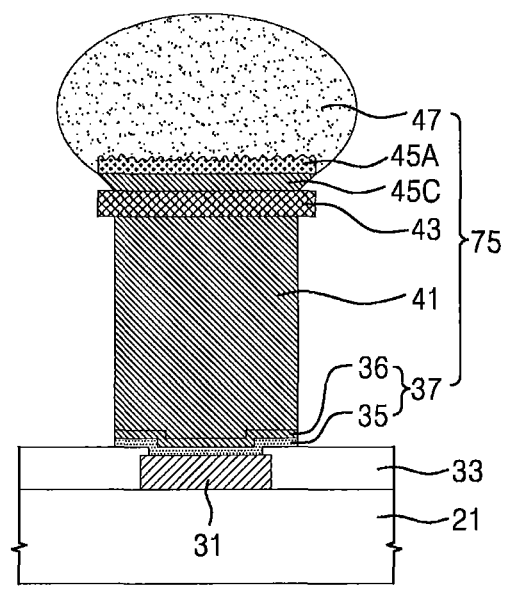

Referring to FIG. 6, a reaction layer 45C may be present between the barrier layer 43 and the IMC layer 45A. A horizontal width of the reaction layer 45C may be smaller than that of the IMC layer 45A. The horizontal width of the reaction layer 45C may be smaller than that of the barrier layer 43. The reaction layer 45C may have inclined side surfaces. The side surfaces of the reaction layer 45C may have inverted inclines. A width of an upper portion of the reaction layer 45C may be greater than that of a lower portion thereof. The reaction layer 45C may have an inverted trapezoidal shape. The reaction layer 45C may include a Cu layer formed through an electroplating method.

Figure 7:
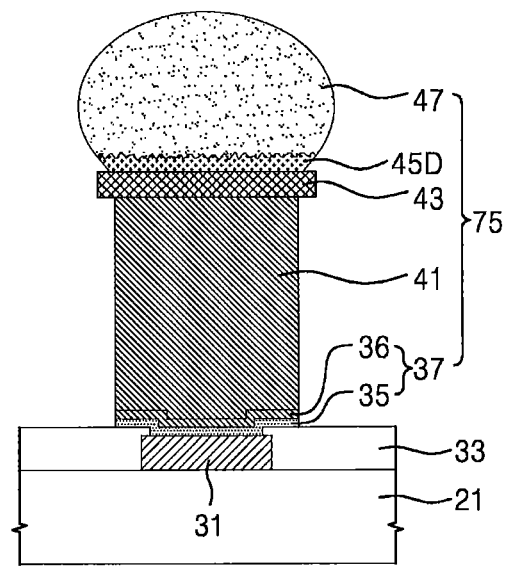

Referring to FIG. 7, an IMC layer 45D may have inclined side surfaces. The side surfaces of the IMC layer 45D may have inverted inclines in which a width of an upper portion of the IMC layer 45D may be greater than that of a lower portion thereof. The IMC layer 45D may have an inverted trapezoidal shape.

Figure 8:
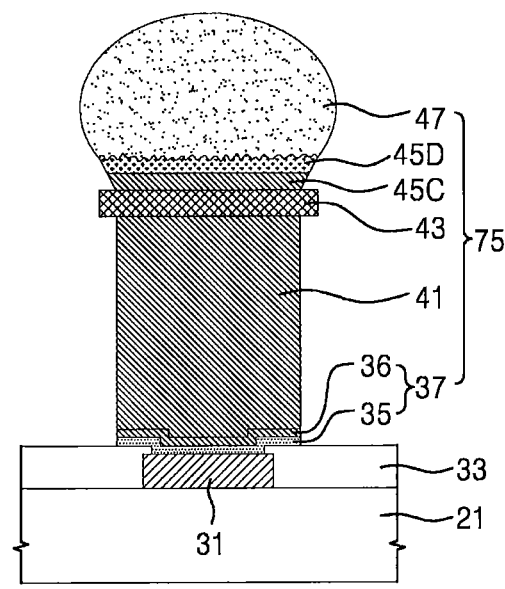

Referring to FIG. 8, the reaction layer 45C may be present between the barrier layer 43 and the IMC layer 45D. The IMC layer 45D may have inclined side surfaces. The side surfaces of the IMC layer 45D may have inverted inclines. The width of an upper portion of the IMC layer 45D may be greater than that of a lower portion thereof. The IMC layer 45D may have an inverted trapezoidal shape. A horizontal width of the reaction layer 45C may be smaller than that of the IMC layer 45D. The horizontal width of the reaction layer 45C may be smaller than that of the barrier layer 43. The reaction layer 45C may have inclined side surfaces. The side surfaces of the reaction layer 45C may have inverted inclines. The width of the upper portion of the reaction layer 45C may be greater than that of the lower portion thereof. The reaction layer 45C may have an inverted trapezoidal shape.

Figure 9:
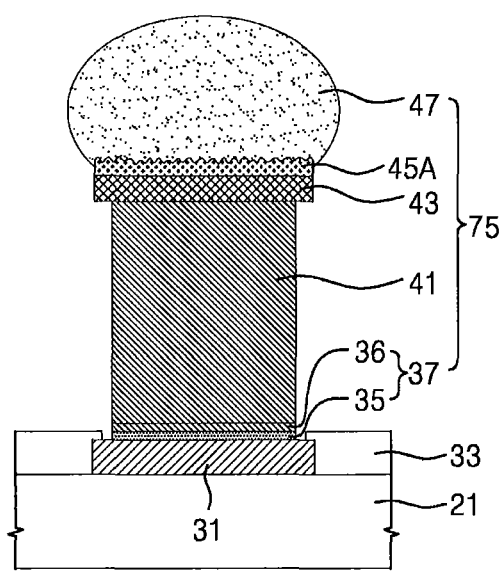

Referring to FIG. 9, the conductive pad 31 may have a greater width than the conductive support layer 41.

Figure 10:
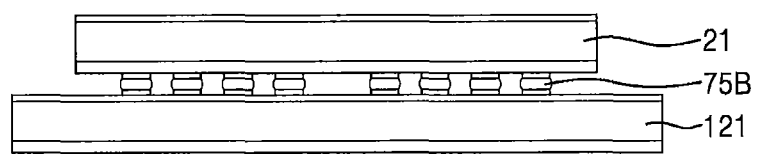

Referring to FIG. 10, the substrate 21 may be interpreted as a first substrate. The first substrate 21 may include a semiconductor chip. First bumps 75B similar to those described with reference to FIGS. 1 to 9 may be formed on the first substrate 21. The first substrate 21 may be mounted on a second substrate 121. The first bumps 75B may be interposed between the first substrate 21 and the second substrate 121. The second substrate 121 may include a printed circuit board (PCB), an interposer, or a semiconductor chip. The first bumps 75B may be in contact with the first substrate 21 and the second substrate 121. The first bumps 75B may serve to provide signal transfer paths to the first substrate 21 and the second substrate 121.

Figure 11:
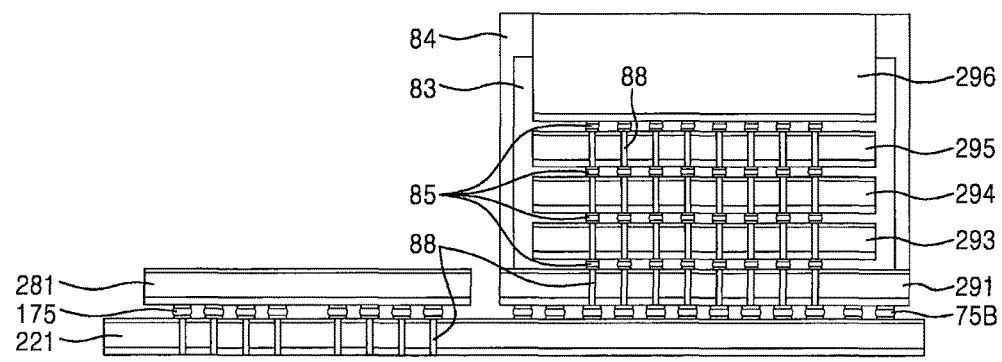

Referring to FIG. 11, a first semiconductor chip 291 may be mounted on an interposer 221. A second semiconductor chip 293, a third semiconductor chip 294, a fourth semiconductor chip 295, and a fifth semiconductor chip 296 may be sequentially stacked on the first semiconductor chip 291. A first encapsulant 83 and a second encapsulant 84 may be formed on the first semiconductor chip 291. A sixth semiconductor chip 281 may be mounted on the interposer 221. Each of the interposer 221, the first semiconductor chip 291, the second semiconductor chip 293, the third semiconductor chip 294, and the fourth semiconductor chip 295 may include via electrodes 88.

The first bumps 75B may be formed between the interposer 221 and the first semiconductor chip 291. The first bumps 75B may be similar to those described with reference to FIGS. 1 to 9. Second bumps 85 may be formed between the first semiconductor chip 291 and the second semiconductor chip 293, between the second semiconductor chip 293 and the third semiconductor chip 294, between the third semiconductor chip 294 and the fourth semiconductor chip 295, and between the fourth semiconductor chip 295 and the fifth semiconductor chip 296. Third bumps 175 may be formed between the interposer 221 and the sixth semiconductor chip 281.

The interposer 221 may include a semiconductor substrate such as a silicon (Si) interposer. The first semiconductor chip 291 may be a logic chip such as a buffer chip having a static random access memory (SRAM) cell. Each of the second semiconductor chip 293, the third semiconductor chip 294, the fourth semiconductor chip 295, and the fifth semiconductor chip 296 may include a memory chip such as a dynamic random access memory (DRAM). The sixth semiconductor chip 281 may include a central processing unit (CPU), a graphic processing unit (GPU), an accelerated processing unit (APU), or an application processor (AP).

Figure 12:
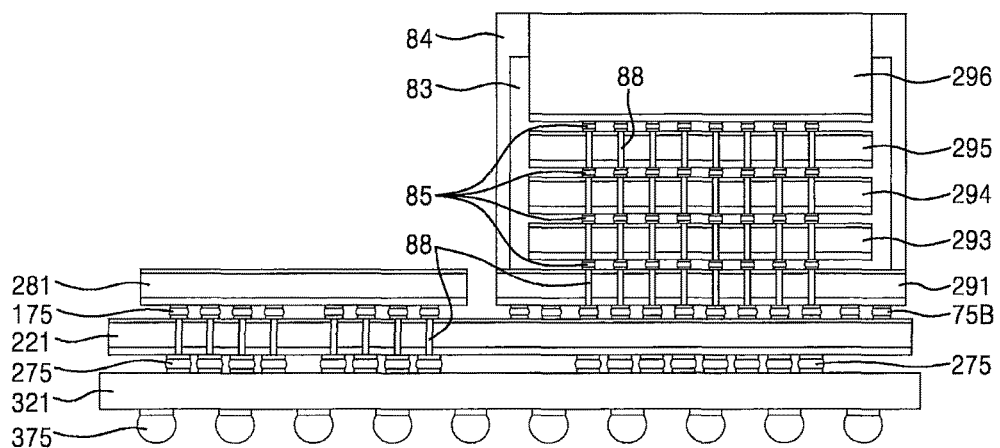

Referring to FIG. 12, an interposer 221 may be mounted on a main board 321. A first semiconductor chip 291 may be mounted on the interposer 221. A second semiconductor chip 293, a third semiconductor chip 294, a fourth semiconductor chip 295, and a fifth semiconductor chip 296 may be sequentially stacked on the first semiconductor chip 291. A first encapsulant 83 and a second encapsulant 84 may be formed on the first semiconductor chip 291. A sixth semiconductor chip 281 may be mounted on the interposer 221. Each of the interposer 221, the first semiconductor chip 291, the second semiconductor chip 293, the third semiconductor chip 294, and the fourth semiconductor chip 295 may include via electrodes 88.

First bumps 75B may be formed between the interposer 221 and the first semiconductor chip 291. The first bumps 75B may be similar to those described with reference to FIGS. 1 to 9. Second bumps 85 may be formed between the first semiconductor chip 291 and the second semiconductor chip 293, between the second semiconductor chip 293 and the third semiconductor chip 294, between the third semiconductor chip 294 and the fourth semiconductor chip 295, and between the fourth semiconductor chip 295 and the fifth semiconductor chip 296. Third bumps 175 may be formed between the interposer 221 and the sixth semiconductor chip 281. Fourth bumps 275 may be formed between the interposer 221 and the main board 321.

The main board 321 may include a PCB such as a flexible PCB, a rigid PCB, or a rigid-flexible PCB. External terminals 375 may be formed under the main board 321. The main board 321 may correspond to a package board. Each of the external terminals 375 may include a solder ball, a bump, a conductive fin, a conductive tab, a conductive lead, or a combination thereof.

The interposer 221 may include a semiconductor substrate such as a Si interposer. The first semiconductor chip 291 may be a logic chip such as a buffer chip having an SRAM cell. Each of the second semiconductor chip 293, the third semiconductor chip 294, the fourth semiconductor chip 295, and the fifth semiconductor chip 296 may include a memory chip such as a DRAM. The sixth semiconductor chip 281 may include a CPU, a GPU, an APU, or an AP.

In some aspects, each of the external terminals 375, the second bumps 85, the third bumps 175, and/or the fourth bumps 275 may be similar to that described with reference to FIGS. 1 to 9. For example, the external terminals 375, the second bumps 85, the third bumps 175, and/or the fourth bumps 275 may include a solder layer covering side surfaces of an IMC layer and in contact with side surfaces of a barrier layer, as illustrated in FIG. 2. As another example, the external terminals 375, the second bumps 85, the third bumps 175, and/or the fourth bumps 275 may include a conductive support layer having inclined side surfaces in which a width of an upper portion of the conductive support layer is greater than that of a lower portion, when viewed cross-sectionally, as discussed above with reference to FIG. 3 and as illustrated therein. As a further example, the external terminals 375, the second bumps 85, the third bumps 175, and/or the fourth bumps 275 may include a reaction layer 45B or reaction layer 45C as illustrated in FIGS. 5 and 6.

In some aspects, the semiconductor device may be applied to a high bandwidth memory (HBM).

Figure 13:
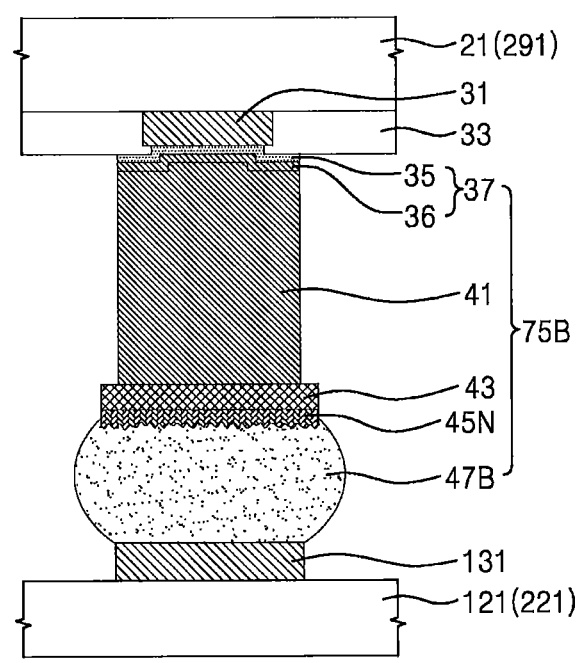

Referring to FIG. 13, a first substrate 21 may be mounted on a second substrate 121. A first bump 75B may be interposed between the first substrate 21 and the second substrate 121. The first bump 75B may include a seed layer 37, a conductive support layer 41, a barrier layer 43, an IMC layer 45N, and a solder layer 47B. A second conductive pad 131 may be formed on the second substrate 121.

The second conductive pad 131 may be in contact with the solder layer 47B. For example, the second conductive pad 131 may include Ni, Cu, or a combination thereof. The IMC layer 45N may include Cu, Ni, and Sn. The solder layer 47B may include Sn, Ag, and Cu.

In some aspects, the first substrate 21 may correspond to the first semiconductor chip 291 of FIG. 12. The second substrate 121 may correspond to the interposer 221 of FIG. 12.

In some aspects, the first bump 75B may be similar to that described with reference to FIGS. 1 to 9. For example, the first bump 75B may include a solder layer covering side surfaces of an IMC layer and in contact with side surfaces of a barrier layer, as illustrated in FIG. 2. As another example, the first bump 75B may include a conductive support layer having inclined side surfaces in which a width of an upper portion of the conductive support layer is greater than that of a lower portion, when viewed cross-sectionally, as discussed above with reference to FIG. 3 and as illustrated therein. As a further example, the first bump 75B may include a reaction layer 45B or reaction layer 45C as illustrated in FIGS. 5 and 6.

Figure 14:
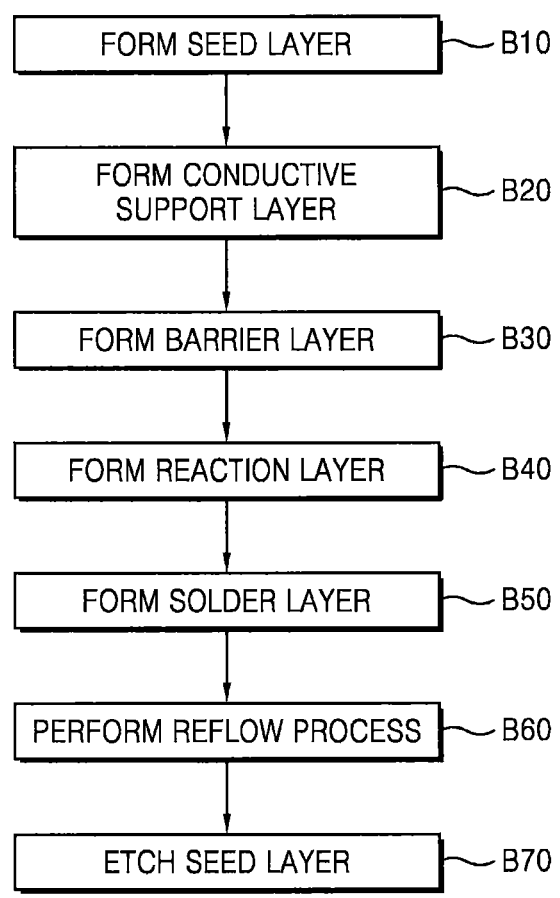
FIG. 14 is a flowchart illustrating a method of forming a semiconductor device according to aspects of the present disclosure.

FIG. 14 is a flowchart for describing a method of forming a semiconductor device according to aspects of the present disclosure.

Referring to FIG. 14, the method of forming the semiconductor device according to aspects of the present disclosure may include forming a seed layer (B10), forming a conductive support layer (B20), forming a barrier layer (B30), forming a reaction layer (B40), forming a solder layer (B50), performing a reflow process (B60), and etching the seed layer (B70).

The reflow process (B60) may be performed before the etching of the seed layer (B70). Hereinafter, the method will be briefly described with reference to cross-sectional views for each process.

FIGS. 15 to 24B are cross-sectional views for describing a method of forming a semiconductor device according to aspects of the present disclosure.

Figure 15:
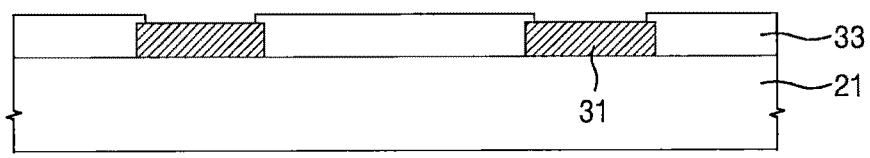
FIGS. 15 to 24B are cross-sectional views illustrating a method of forming a semiconductor device according to aspects of the present disclosure.

Referring to FIGS. 14 and 15, conductive pads 31 and a protective layer 33 may be formed on a substrate 21.

The substrate 21 may be a semiconductor substrate such as a silicon wafer or a silicon on insulator (SOI) wafer. The conductive pads 31 may correspond to bond pads, redistribution pads, via electrodes, or combinations thereof. Each of the conductive pads 31 may include a conductive layer such as tungsten (W), tungsten nitride (WN), titanium (Ti), titanium nitride (TiN), titanium-aluminum (TiAl), titanium-aluminum-carbon (TiAlC), tantalum (Ta), tantalum nitride (TaN), nickel (Ni), cobalt (Co), manganese (Mn), aluminum (Al), molybdenum (Mo), ruthenium (Ru), platinum (Pt), silver (Ag), gold (Au), copper (Cu), tin (Sn), indium (In), a conductive carbon, or a combination thereof. The conductive pads 31 may be electrically connected to active/passive elements (not illustrated) formed on the substrate 21. The protective layer 33 may cover the substrate 21 and edges of the conductive pads 31. The protective layer 33 may include an insulating layer such as silicon oxide ($SiO_x$), silicon nitride ($SiN_x$), silicon oxynitride (SiON), or a combination thereof. Upper surfaces of the conductive pads 31 may be partially exposed.

In some aspects, the substrate 21 may include a flexible PCB, a rigid PCB, a rigid-flexible PCB, or a combination thereof. The substrate 21 may include a multi-layered PCB. The conductive pads 31 may correspond to finger electrodes, via electrodes, or combinations thereof. The protective layer 33 may include an insulating layer such as a solder resist.

Figure 16:
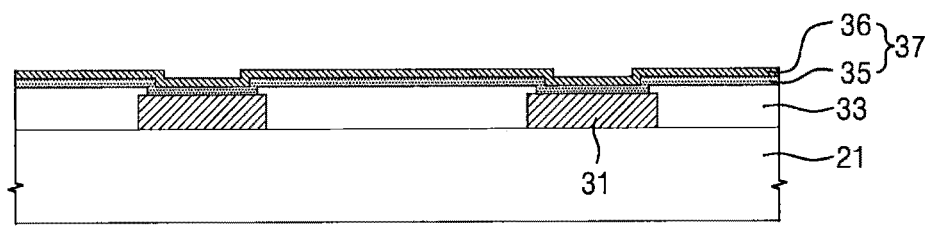

Referring to FIGS. 14 and 16, a seed layer 37 may be formed on the substrate 21 (B10).

The seed layer 37 may include a first seed layer 35 and a second seed layer 36 formed on the first seed layer 35. The first seed layer 35 may include a Ti layer formed through a PVD method. The second seed layer 36 may include a Cu layer formed through a PVD method. The seed layer 37 may be in contact with upper surfaces of the conductive pads 31 and may cover the protective layer 33. The seed layer 37 may cover the entire surface of the substrate 21. The seed layer 37 may serve as an electrode in an electroplating process.

Figure 17:
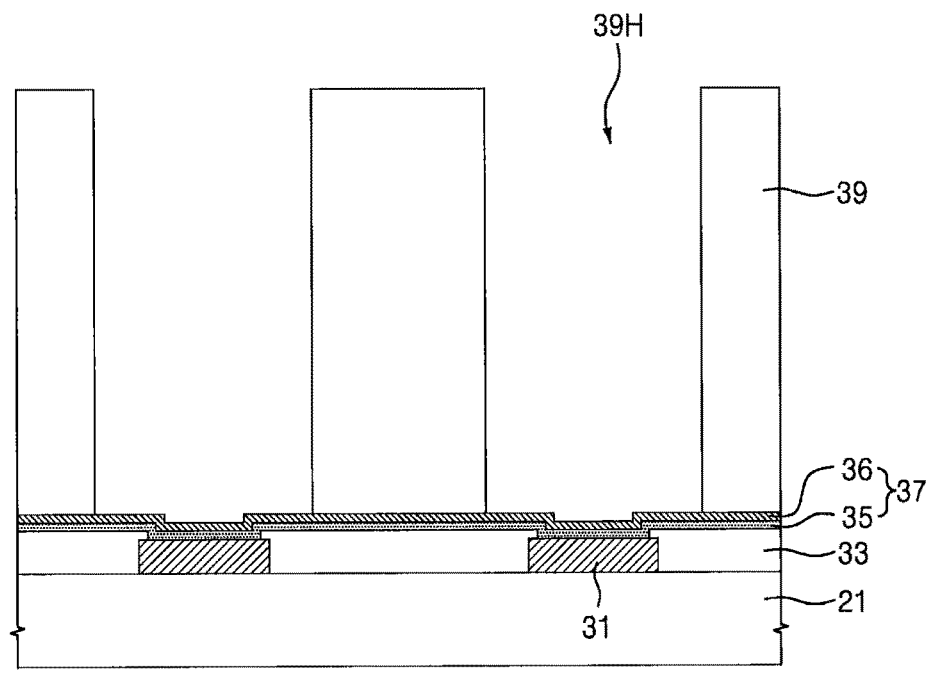

Referring to FIGS. 14 and 17, a mold layer 39 may be formed on the seed layer 37. The mold layer 39 may include aligned holes 39H on the conductive pads 31. A surface of the second seed layer 36 may be exposed by bottoms of the holes 39H. The mold layer 39 may include photoresist patterns. The mold layer 39 may be formed using a photolithography process.

In some aspects, each of the holes 39H may have an inverted trapezoidal shape of which a width of an upper portion is greater than that of a lower portion. A vertical height of the hole 39H may be greater than a horizontal width thereof.

Figure 18:
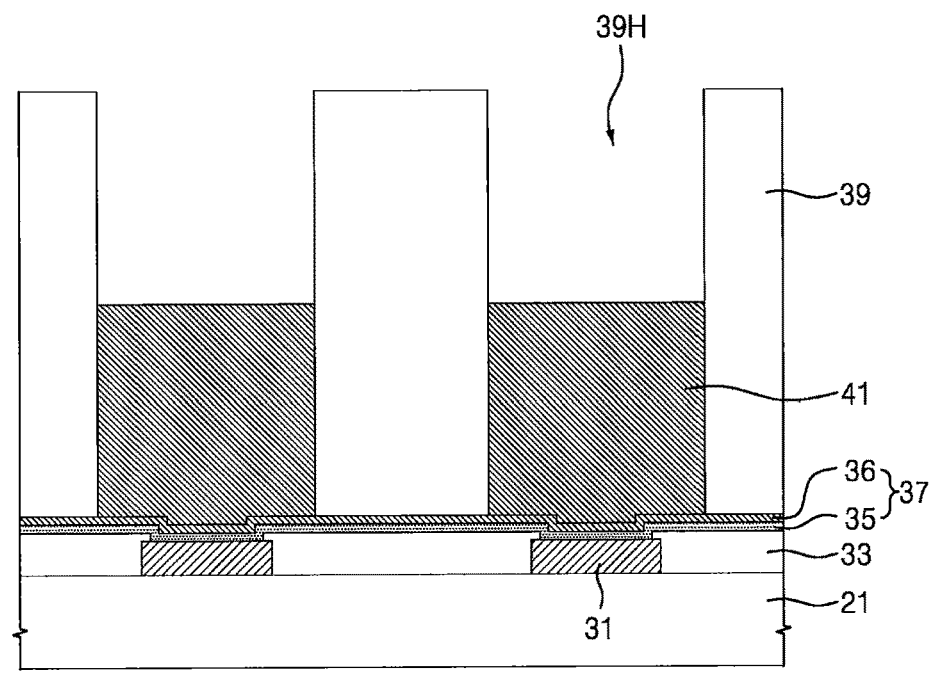

Referring to FIGS. 14 and 18, conductive support layers 41 may be formed on the seed layer 37 in the holes 39H (B20).

Each of the conductive support layers 41 may be directly in contact with an upper surface of the seed layer 37. The conductive support layer 41 may include a Cu layer formed through an electroplating method. The conductive support layer 41 may be formed to have a greater vertical thickness than the seed layer 37. Side surfaces of the conductive support layer 41 may be aligned with inner walls of the hole 39H. A vertical thickness of the conductive support layer 41 may be 0.5 or more times a horizontal width thereof. For example, the vertical thickness of the conductive support layer 41 may be in a range of 0.5 times to 2 times the horizontal width thereof. The conductive support layer 41 may be aligned on the conductive pad 31. The conductive support layer 41 may be formed at a lower level than an upper end of the mold layer 39.

In some aspects, the conductive support layer 41 may include Cu, Co, Ni, or a combination thereof.

Figure 19:
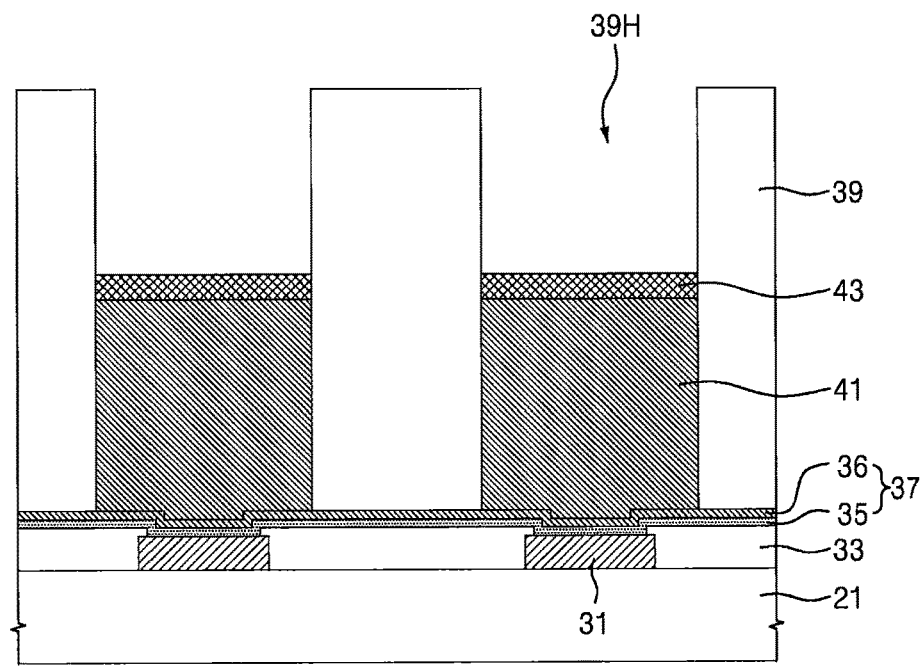

Referring to FIGS. 14 and 19, a barrier layer 43 may be formed on the conductive support layers 41 (B30).

The barrier layer 43 may be directly in contact with an upper surface of the conductive support layer 41. The barrier layer 43 may include a material different from the conductive support layer 41. The barrier layer 43 may include a Ni layer formed through an electroplating method. The barrier layer 43 may be formed to have a smaller vertical thickness than the conductive support layer 41. The barrier layer 43 may have the same horizontal width as the conductive support layer 41. Side surfaces of the barrier layer 43 may be vertically aligned with the side surfaces of the conductive support layer 41. The barrier layer 43 may be formed at a lower level than the upper end of the mold layer 39.

In some aspects, the barrier layer 43 may include Cu, Co, Ni, or a combination thereof.

Figure 20:
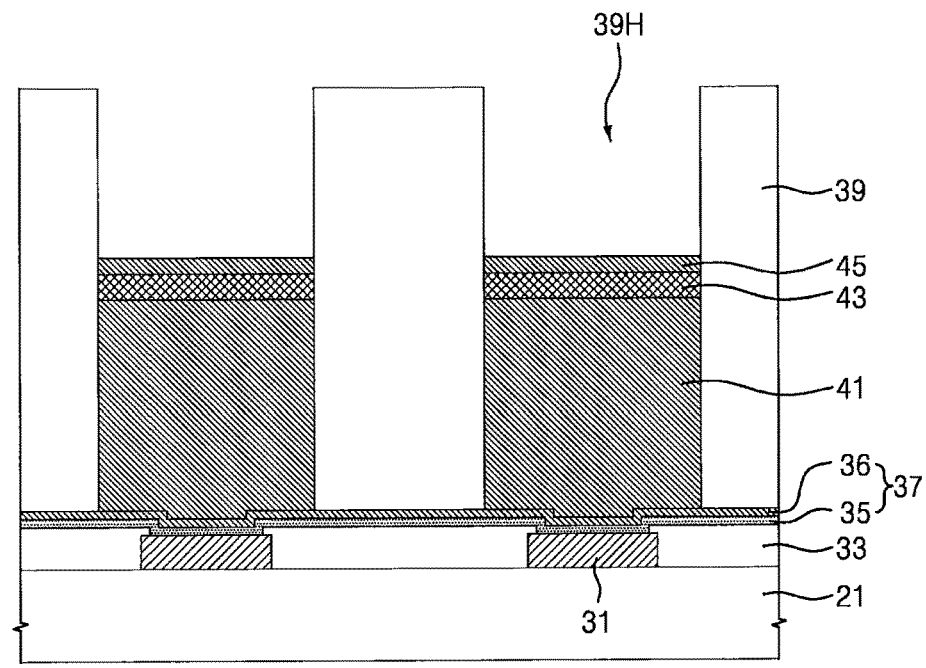

Referring to FIGS. 14 and 20, a reaction layer 45 may be formed on the barrier layer 43 (B40).

The reaction layer 45 may be directly in contact with an upper surface of the barrier layer 43. The reaction layer 45 may include a material different from the barrier layer 43. The reaction layer 45 may include the same material as the conductive support layer 41. The reaction layer 45 may include a Cu layer formed through an electroplating method. A vertical thickness of the reaction layer 45 may be equal to or smaller than that of the barrier layer 43. The reaction layer 45 may be formed at a lower level than the upper end of the mold layer 39. The reaction layer 45 may have the same horizontal width as the barrier layer 43. Side surfaces of the reaction layer 45 may be vertically aligned with the side surfaces of the barrier layer 43.

Figure 21:
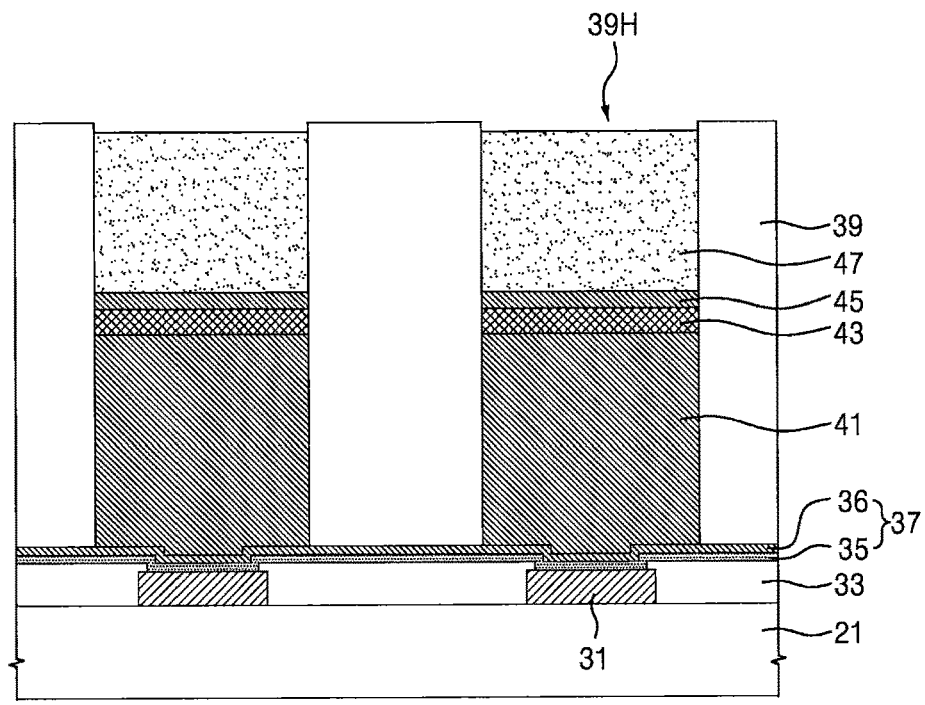

Referring to FIGS. 14 and 21, a solder layer 47 may be formed on the reaction layer 45 (B50).

The solder layer 47 may be directly in contact with an upper surface of the reaction layer 45. The solder layer 47 may include a SnAg layer formed through an electroplating method. A vertical thickness of the solder layer 47 may be smaller than that of the conductive support layer 41 and greater than that of each of the reaction layer 45 and the barrier layer 43. Side surfaces of the solder layer 47 may be vertically aligned with the side surfaces of the reaction layer 45. The solder layer 47 may fill the inside of the hole 39H.

In some aspects, the solder layer 47 may include Sn, Ag, In, Cu, or a combination thereof. The solder layer 47 may include a SnAg layer, a SnAgCu layer, or a combination thereof.

Figure 22:
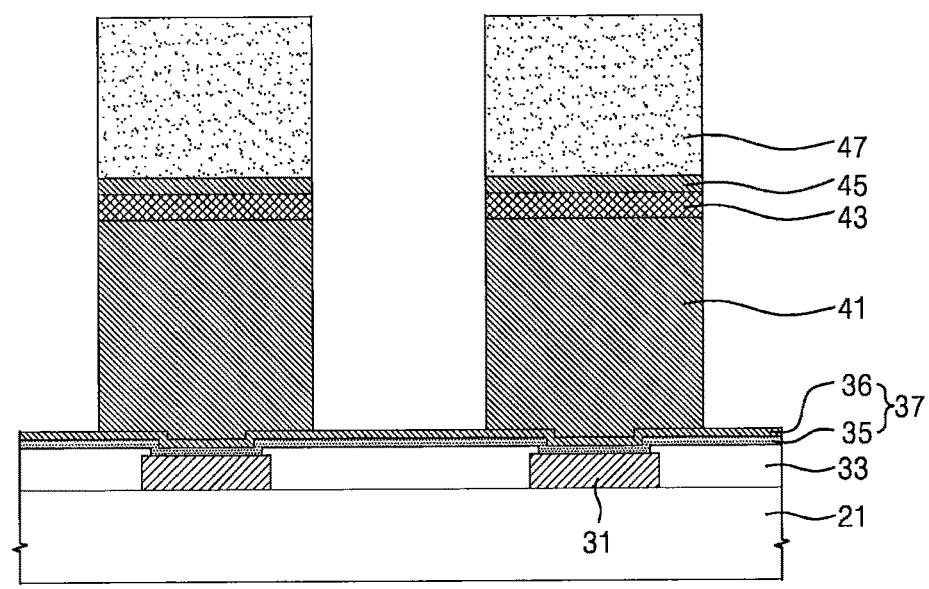

Referring to FIGS. 14 and 22, by removing the mold layer 39, the upper surface of the seed layer 37 may be exposed, and the side surfaces of the conductive support layer 41, barrier layer 43, reaction layer 45, and solder layer 47 may be exposed. The side surfaces of the conductive support layer 41, barrier layer 43, reaction layer 45, and solder layer 47 may be vertically aligned. The side surfaces of the conductive support layer 41, barrier layer 43, reaction layer 45, and solder layer 47 may be exposed substantially in the same plane. The reaction layer 45 may be interposed between the barrier layer 43 and the solder layer 47. The barrier layer 43 and the solder layer 47 may be spaced apart from each other.

Figure 23:
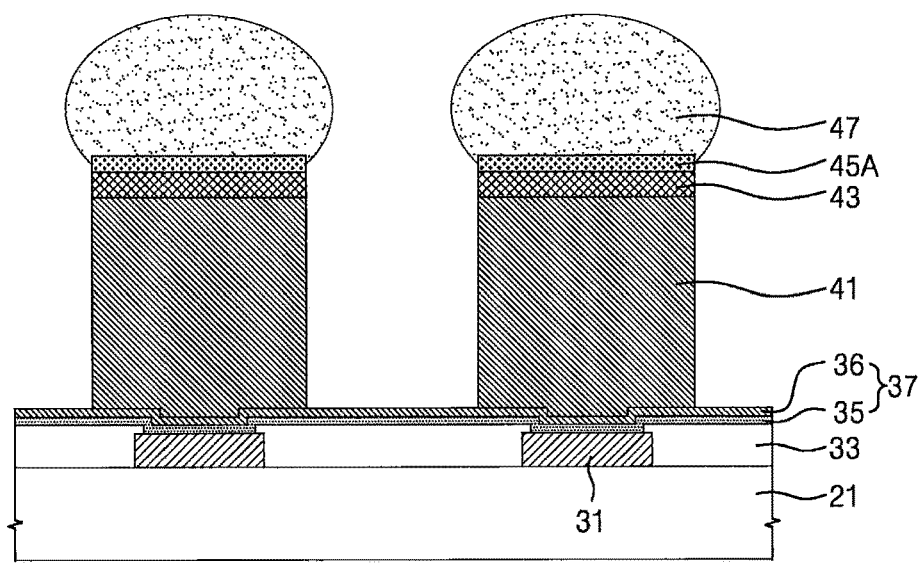

Referring to FIGS. 14 and 23, by performing a reflow process, an IMC layer 45A may be formed (B60).

While the reflow process is performed, constituent materials of the reaction layer 45 and the solder layer 47 may react with each other to form the IMC layer 45A. The IMC layer 45A may include a CuSn layer. The reflow process may be performed in an atmosphere with a temperature in a range of 150° C. to 270° C.

An upper surface of the solder layer 47 may be roundly formed. The solder layer 47 may be directly in contact with an upper surface of the IMC layer 45A. The solder layer 47 may be in contact with side surfaces of the IMC layer 45A. The side surfaces of the IMC layer 45A may be vertically aligned with the side surfaces of the barrier layer 43. The side surfaces of the IMC layer 45A and the barrier layer 43 may be exposed substantially in the same plane. A horizontal width of the IMC layer 45A may be substantially the same as that of the barrier layer 43. The IMC layer 45A may be directly in contact with the upper surface of the barrier layer 43.

According to the method of forming the semiconductor device according to the aspects of the present disclosure, while the reflow process is performed, the barrier layer 43 does not come in contact with the solder layer 47 due to the intervention of the reaction layer 45 and the IMC layer 45A. While the reflow process is performed, the generation of a compound layer due to the reaction of the barrier layer 43 and the solder layer 47 that results in the reduction of reliability may be fundamentally, substantially, or partially blocked.

In some aspects, Cu in the reaction layer 45 may be diffused into the solder layer 47. The reaction layer 45 may be present between the barrier layer 43 and the IMC layer 45A.

In some aspects, the reflow process may be performed before the mold layer 39 is removed.

Figure 24A:
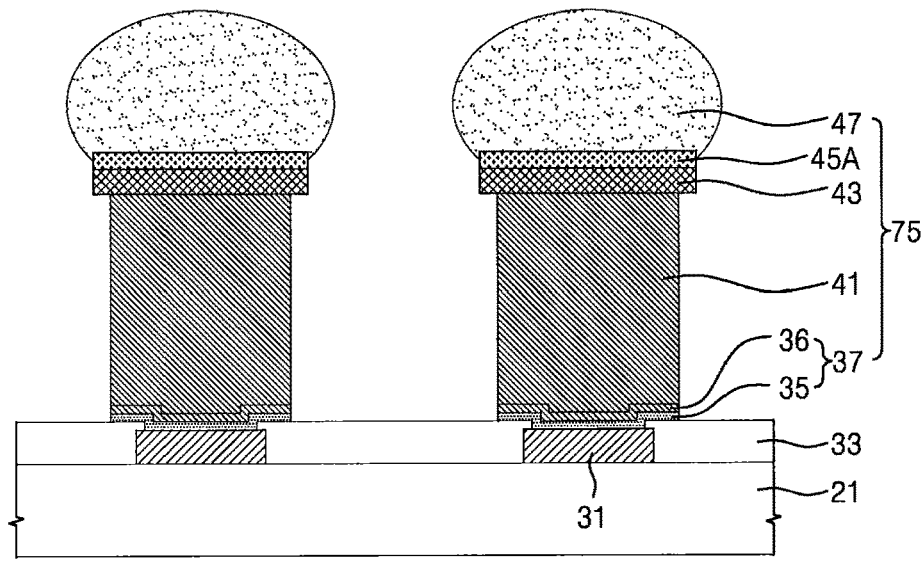

Referring to FIGS. 14 and 24A, the protective layer 33 may be exposed by etching the seed layer 37 (B70).

While the seed layer 37 is etched, the side surfaces of the conductive support layer 41 are etched, and thus the horizontal width of the conductive support layer 41 may be decreased. The seed layer 37 may remain under the conductive support layer 41. The seed layer 37, the conductive support layer 41, the barrier layer 43, the IMC layer 45A, and the solder layer 47 may constitute a bump 75. The IMC layer 45A may have an etch selectivity with respect to the conductive support layer 41 and the seed layer 37. The IMC layer 45A may remain between the barrier layer 43 and the solder layer 47.

According to the method of forming the semiconductor device according to the aspects of the present disclosure, the reflow process (B60) may be performed before the etching of the seed layer 37 (B70). While the reflow process (B60) is performed, the barrier layer 43 does not come in contact with the solder layer 47. While the reflow process (B60) is performed, the generation of a compound layer due to the reaction of the barrier layer 43 and the solder layer 47 that results in the reduction of reliability may be fundamentally, substantially, or partially blocked. The barrier layer 43 may serve to block the diffusion of constituent materials of the conductive support layer 41 into the IMC layer 45A and the solder layer 47.

In some aspects, when the reaction layer 45 is present between the barrier layer 43 and the IMC layer 45A, while the seed layer 37 is etched, the side surfaces of the reaction layer 45 are etched, and thus the horizontal width of the reaction layer 45 may be decreased.

Figure 24B:
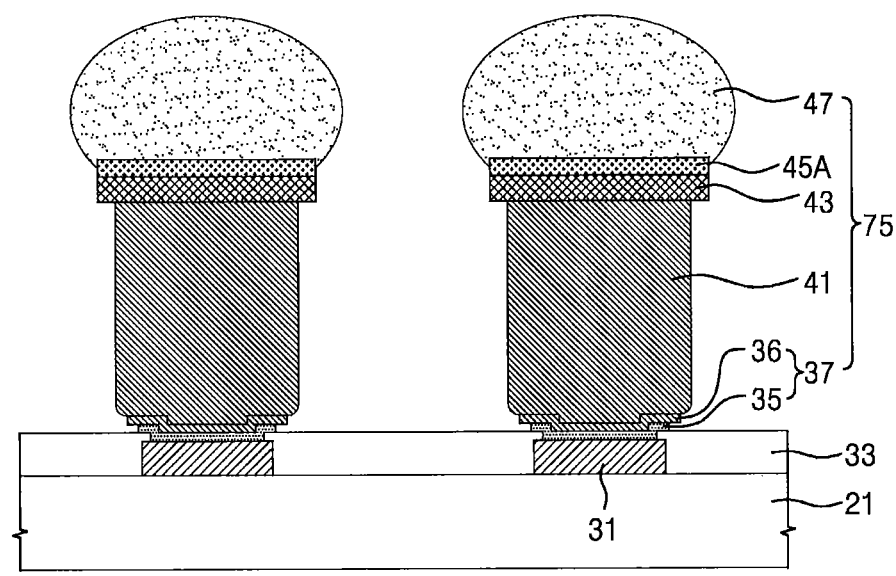

Referring to FIG. 24B, the seed layer 37 may have a greater etching rate than the conductive support layer 41. The seed layer 37 may have a smaller width than the conductive support layer 41. Undercut regions may be formed under the conductive support layer 41. Lower corners of the conductive support layer 41 may be roundly formed. The first seed layer 35 may have a greater etching rate than the second seed layer 36. The first seed layer 35 may have a smaller width than the second seed layer 36. The second seed layer 36 may have a smaller width than the conductive support layer 41.

According to the aspects of the present disclosure, after a reflow process is performed, a process of etching a seed layer may be performed. While the seed layer is etched, side surfaces of a conductive support layer may be etched. While the reflow process is performed, a reaction layer may react with a solder layer to form an IMC layer. While the reflow process is performed, a barrier layer may be separated from the solder layer. While the reflow process is performed, the generation of a compound layer due to the reaction of the barrier layer with the solder layer that results in the reduction of reliability may be fundamentally, substantially, or partially blocked. Therefore, a semiconductor device having a highly reliable conductive support layer bump can be implemented.

Although a few example embodiments have been described with reference to the accompanying drawings, those skilled in the art will readily appreciate that many modifications are possible in embodiments without departing from the scope of the present disclosure and without changing essential features. Therefore, the above-described embodiments should be considered in a descriptive sense only and not for purposes of limitation.

What is claimed is:

1. A semiconductor device, comprising:
a conductive pad on a substrate;
a conductive support layer on the conductive pad and comprising a first width and a vertical thickness that is at least 0.5 times the first width;
an intermetallic compound (IMC) layer on the conductive support layer and comprising a second width greater than the first width; and
a solder layer on the IMC layer.

2. The semiconductor device of claim 1, further comprising a barrier layer between the conductive support layer and the IMC layer.

3. The semiconductor device of claim 2, wherein the barrier layer comprises a third width substantially equal to the second width.

4. The semiconductor device of claim 3, wherein the first width is smaller than the third width.

5. The semiconductor device of claim 2, wherein side surfaces of the IMC layer are vertically aligned with side surfaces of the barrier layer.

6. The semiconductor device of claim 2, wherein the conductive support layer comprises an upper portion and a lower portion, and wherein a distance between sidewalls of the conductive support layer at the upper portion is greater than a distance between sidewalls of the conductive support layer at the lower portion.

7. The semiconductor device of claim 2, wherein the solder layer contacts side surfaces of the IMC layer, and wherein a lower end of the solder layer is formed between an upper end of the IMC layer and a lower end of the barrier layer.

8. The semiconductor device of claim 2, wherein the conductive support layer comprises a copper (Cu) layer, the barrier layer comprises a nickel (Ni) layer, the IMC layer comprises a copper-tin (CuSn) layer, and the solder layer comprises a tin-silver (SnAg) layer.

9. The semiconductor device of claim 2, wherein the IMC layer comprises inclined side surfaces, an upper portion and a lower portion, wherein the upper portion comprises the second width and the lower portion comprises a third width, and wherein the third width is smaller than the second width.

10. The semiconductor device of claim 2, further comprising:
a reaction layer between the barrier layer and the IMC layer, wherein the reaction layer comprises a copper (Cu) layer.

11. The semiconductor device of claim 10, wherein the reaction layer comprises a smaller horizontal width than a width of the barrier layer and the second width.

12. The semiconductor device of claim 10, wherein the reaction layer comprises inclined side surfaces tapered toward the barrier layer.

13. The semiconductor device of claim 12, wherein the IMC layer comprises inclined side surfaces tapered toward the reaction layer.

14. The semiconductor device of claim 1, further comprising a seed layer formed between the conductive pad and the conductive support layer.

15. A semiconductor device, comprising:
a first substrate;
a first semiconductor chip on the first substrate;
a bump between the first substrate and the first semiconductor chip; and
at least one second semiconductor chip on the first semiconductor chip,
wherein the bump comprises:
a barrier layer on a conductive support layer;
an intermetallic compound (IMC) layer on the barrier layer; and
a solder layer on the IMC layer, and
wherein the conductive support layer has a smaller width than the IMC layer and is at least 0.5 times vertically thicker than it is wide.

16. The semiconductor device of claim 15, wherein the bump is located on a via electrode extending through the first semiconductor chip to the at least one second semiconductor chip.

17. A semiconductor device, comprising:
a conductive pad on a substrate;

a seed layer on the conductive pad;

a conductive support layer on the seed layer and comprising a first width and a vertical thickness that is at least 0.5 times the first width;

a compound metal layer comprising a second width greater than the first width on the conductive support layer; and a solder layer on the compound metal layer.

18. The semiconductor device of claim 17, wherein the seed layer comprises a first seed layer and a second seed layer, wherein the first seed layer comprises a titanium (Ti) layer formed through physical vapor deposition, and wherein the second seed layer comprises a copper (Cu) layer formed through physical vapor deposition.

19. The semiconductor device of claim 17, further comprising an undercut region between the conductive support layer and the substrate, wherein the seed layer comprises a third width smaller than the first width and the second width, and wherein corners of the conductive support layer closest to the substrate are rounded.

20. The semiconductor device of claim 1, wherein the vertical thickness of the conductive support layer is in a range of 0.5 times to 2 times the first width.

* * * * *